United States Patent
Juge et al.

(10) Patent No.: US 9,702,922 B2
(45) Date of Patent: Jul. 11, 2017

(54) METHOD OF LOCATING INTERNAL ARCING IN A GAS-INSULATED LINE AND AN ASSOCIATED DEVICE

(75) Inventors: Patrice Juge, Marcellaz Albanais (FR); Guillaume Granelli, Barberaz (FR)

(73) Assignee: ALSTOM TECHNOLOGY LTD, Baden (CH)

(*) Notice: Subject to any disclaimer, the term of this patent is extended or adjusted under 35 U.S.C. 154(b) by 1183 days.

(21) Appl. No.: 13/806,099

(22) PCT Filed: Jun. 23, 2011

(86) PCT No.: PCT/EP2011/060537
§ 371 (c)(1),
(2), (4) Date: Feb. 28, 2013

(87) PCT Pub. No.: WO2011/161210
PCT Pub. Date: Dec. 29, 2011

(65) Prior Publication Data
US 2013/0191050 A1    Jul. 25, 2013

(30) Foreign Application Priority Data
Jun. 23, 2010  (FR) ...................................... 10 54991

(51) Int. Cl.
*G01R 31/08* (2006.01)
*G01R 31/12* (2006.01)
*G06F 17/00* (2006.01)

(52) U.S. Cl.
CPC ........... *G01R 31/08* (2013.01); *G01R 31/085* (2013.01); *G01R 31/1254* (2013.01); *G06F 17/00* (2013.01); *G01R 31/1272* (2013.01)

(58) Field of Classification Search
CPC .. G01R 31/08; G01R 31/085; G01R 31/1254; G01R 31/1272
See application file for complete search history.

(56) References Cited

U.S. PATENT DOCUMENTS

| 4,484,134 A | 11/1984 | Halloran |
| 5,986,860 A * | 11/1999 | Scott .................... G01R 31/025 361/115 |

(Continued)

FOREIGN PATENT DOCUMENTS

| EP | 2 283 553 B1 | 11/2011 |
| FR | 2 719 125 A1 | 10/1995 |

(Continued)

OTHER PUBLICATIONS

Fukada, Setsuo, "Current-Carrying and Short-Circuit Tests on EHV Cables Insulated with SF6 Gas", IEEE Transactions on Power Apparatus and Systems, vol. PAS-88, No. 2, pp. 147-156, Feb. 1969.

(Continued)

*Primary Examiner* — Hyun Park
*Assistant Examiner* — Liam R Casey
(74) *Attorney, Agent, or Firm* — Nixon Peabody LLP; Khaled Shami

(57) ABSTRACT

A method and a device for locating internal arcing that occurs in a compartment ($CP_i$) of a gas-insulated line (L), each compartment being provided with at least one pressure sensor ($P_i$). The method comprises: triggering pressure measurements in a compartment as soon as the difference between the currents that flow through two current toroids ($TC_i$) around two adjacent compartments exceeds a threshold value indicating the occurrence of internal arcing in the compartment; calculating a period Δt that separates the time at which the pressure detector began to detect a pressure variation and the time at which the internal arcing occurred; and calculating a distance d that separates the place at which the internal arc is formed from the position of the pressure sensor using the equation d=V/Δt in which V is the speed of sound in the gas.

6 Claims, 8 Drawing Sheets

(56) References Cited

U.S. PATENT DOCUMENTS

| | | | |
|---|---|---|---|
| 6,236,548 B1* | 5/2001 | Marmonier | H01H 33/26 361/102 |
| 2004/0012901 A1* | 1/2004 | Kojovic | H02H 3/28 361/19 |
| 2005/0243484 A1 | 11/2005 | Kim | |
| 2007/0014060 A1* | 1/2007 | Land, III | H02H 1/0023 361/42 |
| 2008/0129307 A1* | 6/2008 | Yu | H02H 1/0015 324/522 |
| 2010/0321836 A1* | 12/2010 | Dvorak | H02H 1/0015 361/2 |
| 2012/0019233 A1 | 1/2012 | Juge et al. | |
| 2012/0182708 A1 | 7/2012 | Juge et al. | |

FOREIGN PATENT DOCUMENTS

| | | | |
|---|---|---|---|
| FR | EP 0788207 A1 * | 8/1997 | H02B 13/065 |
| JP | 57-35768 A | 2/1982 | |
| WO | 2011/036241 | 3/2011 | |

OTHER PUBLICATIONS

International Search Report and Written Opinion in International Application No. PCT/EP2011/060537, mailed Jul. 21, 2011.

* cited by examiner

METHOD OF LOCATING INTERNAL ARCING IN A GAS-INSULATED LINE AND AN ASSOCIATED DEVICE

CROSS REFERENCE TO RELATED APPLICATIONS OR PRIORITY CLAIM

This application is a National Phase of PCT/EP2011/060537, filed Jun. 23, 2011, entitled, "METHOD OF LOCATING AN INTERNAL ARC IN A GAS INSULATED LINE AND ASSOCIATED DEVICE", which claims the benefit of French Patent Application No. 10 54991, filed Jun. 23, 2010, the contents of which are incorporated herein by reference in their entirety.

TECHNICAL FIELD AND PRIOR ART

The invention relates to a method of locating internal arcing in a gas-insulated line and to a device adapted to implement the method.

The invention is applied to locating faults on gas-insulated lines with the aim of facilitating maintenance thereof.

A gas-insulated line consists of a conductor placed inside a conductive jacket filled with a dielectric gas under pressure. Electrical energy is transported by the conductor, and the conductive jacket is at a reference potential (zero potential). The nature and the pressure of the dielectric gas are chosen as a function of the voltage that exists between the conductor and the conductive jacket in order to guarantee electrical insulation. For example, a jacket with a diameter of approximately 1 meter (m) and filled with a mixture of sulfur hexafluoride ($SF_6$) and nitrogen ($N_2$) under pressure makes it possible to insulate an aluminum conductor transporting power of the order of 1000 megawatts (MW) to 2000 MW at a voltage of the order of 245 kilovolts (kV) to 400 kV.

The zero potential of the conductive jacket and its small overall size mean that gas-insulated lines may be used at ground level or even buried.

A gas-insulated line may have a length of several kilometers. To guarantee correct pressurization of the gas, the line is compartmented, i.e. made up of a succession of compartments, the gas contained in one compartment being isolated from the gas contained in the adjacent compartments.

There are several prior art systems for locating internal arcing in a gas-insulated line.

For example, there are systems based on detecting light. Those systems are reserved for lines having compartments of small volume. The light sensors need to be mounted at regular intervals, for example every 20 m, taking into account attenuation of the light and the geometrical configuration of the line. This represents a drawback. Another drawback is that the occurrence of arcing is frequently accompanied by the formation of dust, the presence of which can partially or totally block the light.

The invention is free of the drawbacks referred to above.

SUMMARY OF THE INVENTION

The invention provides a method of locating an internal arc in a gas-insulated line consisting of a succession of compartments $CP_i$ (i=1, 2, . . . , N) filled with gas, the method being characterized in that, for each compartment $CP_i$ being surrounded by a current toroid $TC_i$ (i=1, 2, . . . , N) through which there flows a current $I_i$ that is substantially identical from one compartment to another and being provided with at least one pressure sensor $P_i$ adapted to measure the pressure of the gas inside the compartment, the method comprises the following steps:

reading, at a sampling frequency, the various currents $I_i$ that flow through the various current toroids;

calculating, at the sampling frequency, current differences $I_{diffi}$ such that $I_{diffi}=I_{i+1}-I_i$, and storing the calculated current differences; and comparing the stored current differences $I_{diffi}$ with a current threshold value and, as soon as a current difference is greater than or equal to the threshold value at a time $t_i$:

triggering a succession of pressure measurements by the pressure sensor $P_i$, and storing the measured pressure values;

calculating, from the time variations of the stored pressure measurements, a pressure rise time $t_m$ at which the pressure measured by the pressure sensor $P_i$ begins to increase;

calculating a period $\Delta t_P$ that is the difference between the times $t_m$ and $t_i$;

calculating a time $t_0$ that characterizes the occurrence of internal arcing in the compartment $CP_i$ from the time variations of the stored current differences;

calculating a period $\Delta t_i$ that is the difference between the times $t_i$ and $t_0$;

calculating a period $\Delta t$ that is the sum of the previously-calculated periods $\Delta t_i$ and $\Delta t_P$; and calculating the distance d that separates the pressure sensor Pi from the place at which the fault occurred from the equation $d=V/\Delta t$ in which V is the speed of propagation of sound in the gas.

The invention also provides a device for locating an internal arc in a gas-insulated line consisting of a succession of compartment $CP_i$ (i=1, 2, . . . , N) filled with gas, the device being characterized in that it comprises:

N current toroids $TC_i$ (i=1, 2, . . . , N), each surrounding a compartment and having flowing through it a current $I_i$ that is substantially identical from one compartment to another;

N detection modules $DC_i$ (i=1, 2, . . . , N), each able to read the current flowing through the current toroid $TC_i$ and the current $I_{i-1}$ flowing through the current toroid $TC_{i-1}$ and including means for calculating the differences between the currents $I_i$ and $I_{i-1}$, for storing the calculated current differences, and for delivering a command signal as soon as the difference between the currents $I_i$ and $I_{i-1}$ is greater than or equal to a threshold at a time $t_i$;

at least one pressure sensor $P_i$ mounted on each compartment $CP_i$ and adapted to measure the pressure of the gas inside the compartment;

N gas monitoring modules $MG_i$ (i=1, 2, . . . , N) each including means adapted to respond to the command signal by triggering successive measurements by the pressure sensor $P_i$ of the pressure of the gas contained in the compartment $CP_i$ and storing the successive pressure measurements effected; and means adapted to calculate:

from the time variations of the stored pressure measurements, a pressure rise time $t_m$ that is the time at which the pressure measured by the pressure sensor $P_i$ begins to increase;

a period $\Delta t_P$ that is the difference between the times $t_m$ and $t_i$;

from the time variations of the stored current differences, a time $t_0$ that characterizes the occurrence of an internal arc in the compartment $CP_i$;

a period $\Delta t_i$ that is the difference between the times $t_i$ and $t_0$;

a period $\Delta t$ that is the sum of the previously-calculated periods $\Delta t_i$ and $\Delta t_P$; and a distance d that separates the pressure sensor Pi from the place at which the fault has occurred from the equation d=V/Δt in which V is the speed of propagation of sound in the gas.

The method of the invention has one particularly beneficial advantage in that pressure measurement is not triggered by the effect of noise. As a matter of fact, the time interval $\Delta t_i$ that separates the times $t_t$ and $t_0$ may be relatively long (for example 100 milliseconds (ms)), with the result that the value of the current threshold that is intended to reflect the occurrence of arcing may also be relatively high and, in any event, greater than the noise fluctuation values.

The method of the invention also has the advantage of remaining effective if detection times are short (of the order of a few milliseconds), the detection time being an adjustment parameter. Such responsiveness is necessary to detect an insulation defect during off-load dielectric testing of high-voltage equipment, which defect is reflected in the occurrence of a current spike.

The invention is advantageously suited to a wide range of geometries and voltages, for example jackets from approximately 0.4 m to 1 m in diameter and voltages of the order of 245 kV to 400 kV, and smaller jackets and lower voltages, for example 170 kV.

BRIEF DESCRIPTION OF THE DRAWINGS

Other features and advantages of the invention become apparent in the light of the following description given with reference to the appended figures, in which.

In all the figures, the same references designate the same elements.

DETAILED DESCRIPTION OF ONE PARTICULAR EMBODIMENT OF THE INVENTION

Figure 1:
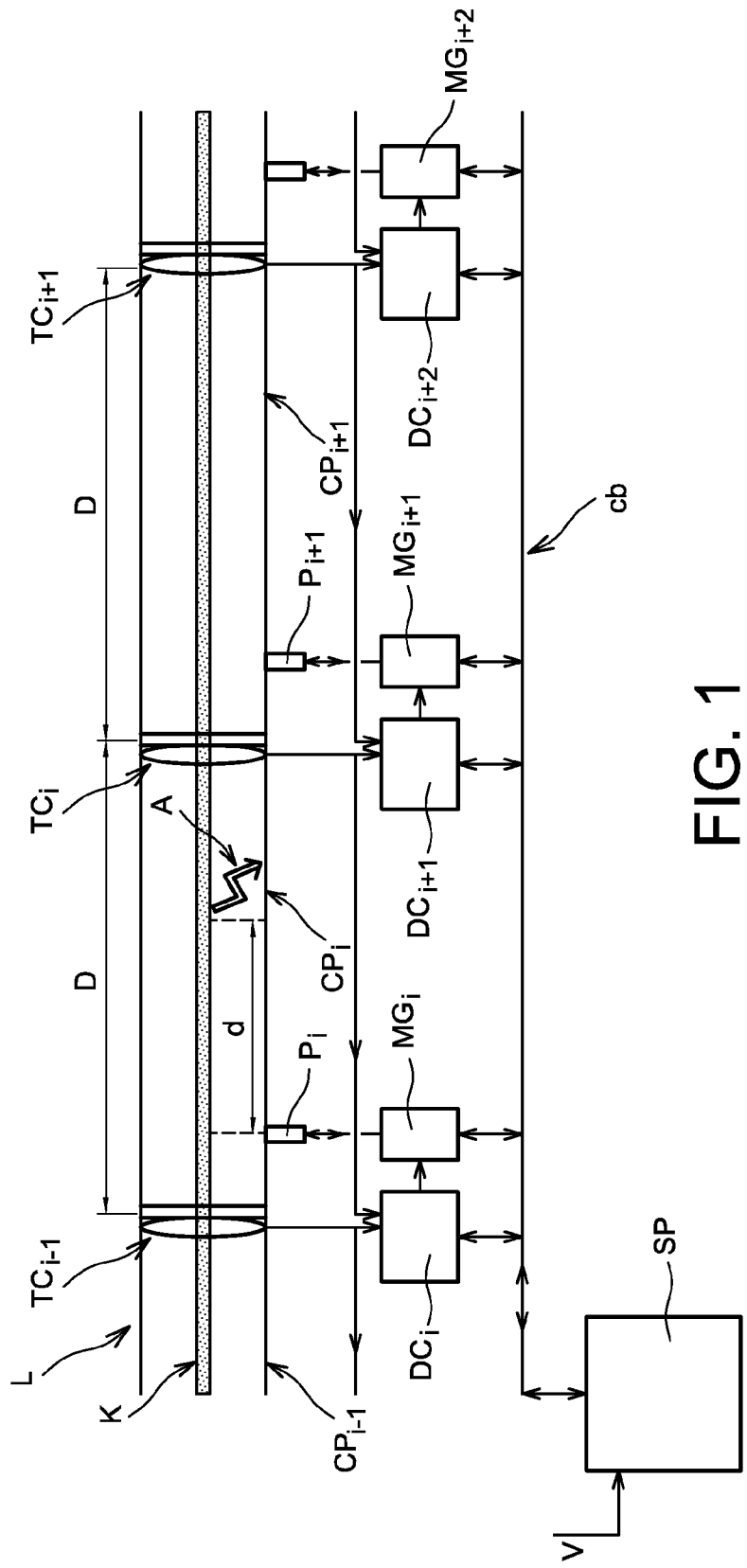
FIG. 1 is a block diagram of a device of the invention for locating an internal arc in a gas-insulated line.

FIG. 1 is a block diagram of a device of one embodiment of the invention for locating an internal arc in a gas-insulated line.

A gas-insulated line L comprises a plurality of compartments $CP_i$ (i=1, 2, . . . , 3, etc.) through which a central conductor K passes. Each compartment $CP_i$ of length D contains gas under pressure, for example $SF_6$ at a pressure of 5 bars at a temperature of 20° C. As mentioned above, the gas contained in one compartment is isolated from the gas contained in the other compartments.

The device of the invention for locating an internal arc comprises a set of current toroids $TC_i$ (i=1, 2, 3, . . . , N), a set of current detection modules $DC_i$ (i=1, 2, 3, . . . , N), a set of pressure sensors $P_i$ (i=1, 2, 3, . . . , N), a set of gas monitoring modules $MG_i$ (i=1, 2, 3, . . . , N), and a supervisory unit SP. In the preferred embodiment of the invention, each current toroid $TC_i$ is mounted on the compartment $CP_i$ substantially at the end of the compartment $CP_i$ adjacent the compartment $CP_{i+1}$ and each pressure sensor $P_i$ is mounted on the compartment $CP_i$ substantially at the end of the compartment adjacent the compartment $CP_{i-1}$. Each detection module $DC_i$ includes an electronic processor circuit for shaping the signals delivered by the current toroid $TC_i$ for processing by the detection module $DC_i$. The supervisory unit SP is for example a calculating device, a computer or a microprocessor.

Each current detection module $DC_i$ (i=1, 2, . . . , N) receives at its input the current $I_i$ flowing through the toroid $TC_i$ and the current $I_{i-1}$ flowing through the toroid $TC_{i-1}$. Moreover, each pressure sensor $P_i$ is connected to the gas monitoring module $MG_i$ and all the detection modules $DC_i$ and gas monitoring modules $MG_i$ are connected to each other and to the supervisory unit SP via the same bidirectional communication bus cb.

Figure 2:
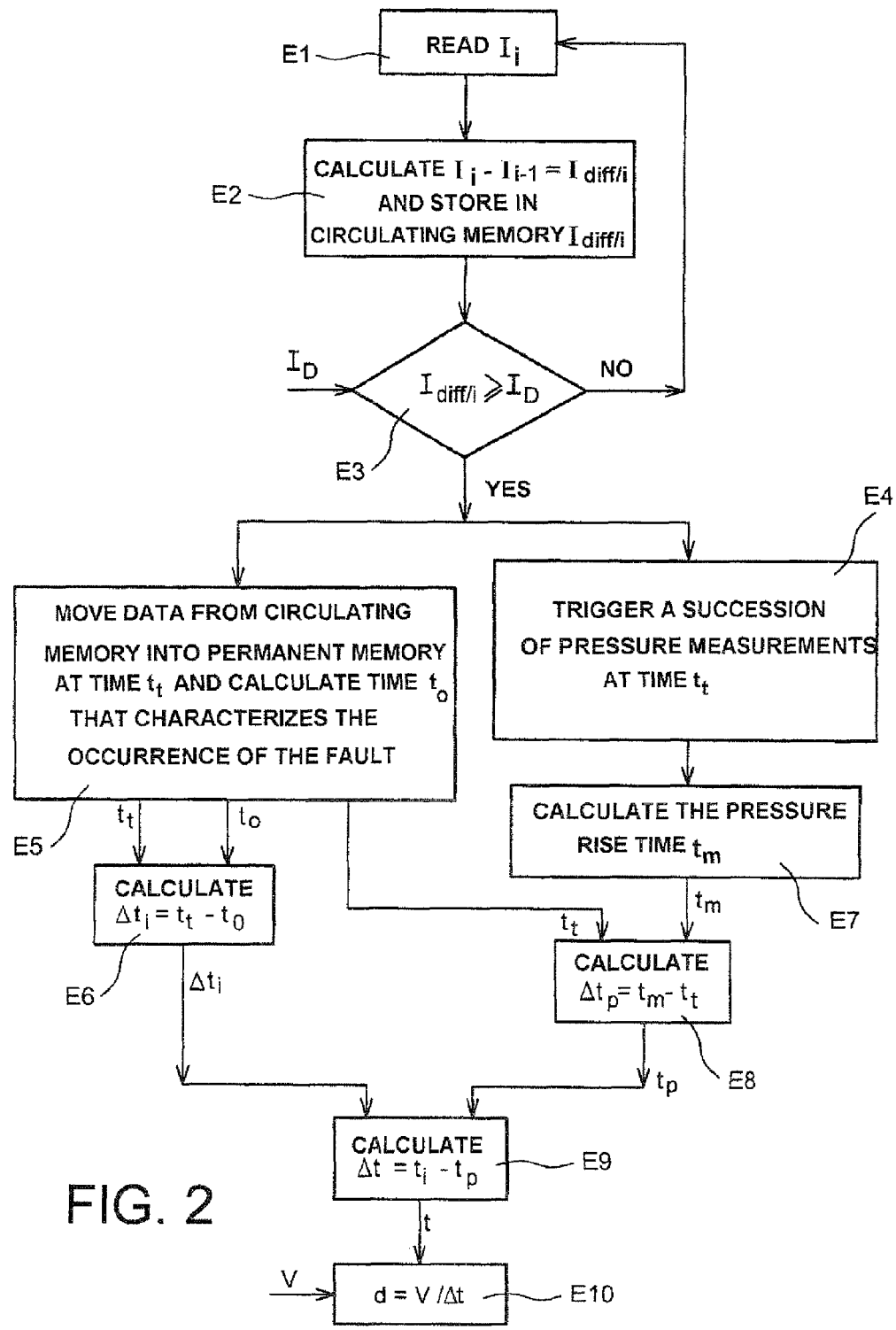
FIG. 2 is a flowchart of a method of the invention for locating an internal arc in a gas-insulated line used by the device from FIG. 1.

FIG. 2 is a flowchart of the method of the invention of locating an internal arc in a gas-insulated line that is used by the FIG. 1 device. The method comprises:

reading at a sampling frequency the currents $I_i$ that flow through the current toroids;

calculating at the sampling frequency current differences $I_{diffi}$ such that $I_{diffi}=I_{i+1}-I_i$ and storing the calculated current differences in a circulating memory;

comparing the current differences $I_{diffi}$ stored in the circulating memory with a current threshold value and as soon as a current difference is greater than or equal to the threshold value, at a time $t_i$:

permanently storing the current differences stored in circulating memory;

triggering a succession of pressure measurements by the pressure sensor $P_i$ and storing the measured pressure values in memory;

calculating from the time variations of the stored pressure measurements a pressure rise time $t_m$ at which the pressure measured by the pressure sensor $P_i$ begins to increase;

calculating a period $\Delta t_P$ that is the difference between the times $t_m$ and $t_i$;

calculating a time $t_0$ that characterizes the occurrence of internal arcing in the compartment $CP_i$ from time variations of current differences stored in permanent memory;

calculating a period $\Delta t_i$ that is the difference between the times $t_i$ and $t_0$;

calculating a period Δt that is the sum of the previously-calculated periods $\Delta t_i$ and $\Delta t_P$; and calculating the distance d that separates the pressure sensor Pi from the place at which internal arcing has occurred from the equation d=V/Δt in which V is the speed of propagation of sound in the gas.

Figure 3A:
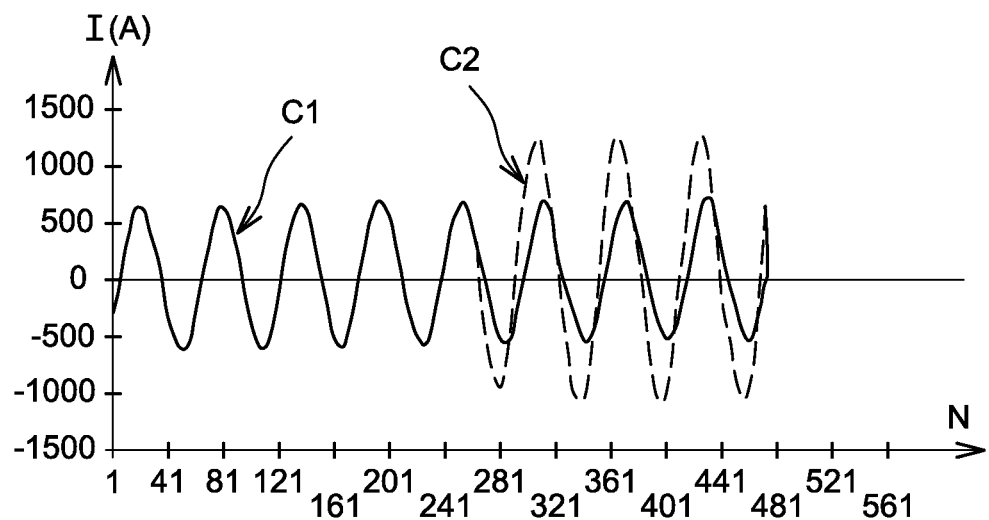
FIGS. 3A-3C represent measured or calculated response signals that assist a fuller understanding of the invention.

In the absence of interference, a sinusoidal current flows through each of the current toroids $TC_i$. The sinusoidal current that flows through each toroid has a constant amplitude that is identical from one toroid to another, for example 4000 amps (A). The curve C1 in FIG. 3A thus represents the variation as a function of time of the current $I_i$ for any value of i, for example (the time variable is represented in FIG. 3A by the succession of sampling point numbers N). If a fault occurs, for example in the compartment $CP_i$ (see the arc A between the conductor K and the conductive jacket represented in FIG. 3A), the current $I_i$ that flows through the toroid $TC_i$ increases in amplitude (see curve C2 in FIG. 3A), whereas in this example the current $I_{i-1}$ remains unchanged (see curve C1).

Figure 3B:
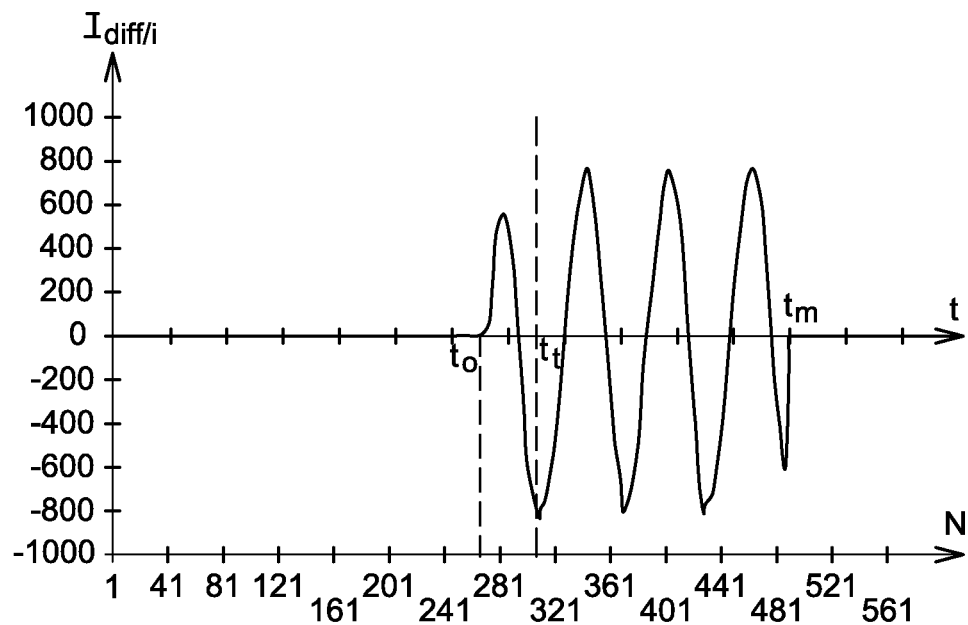

FIG. 3B represents the curve of the current $I_{diffi}$ from FIG. 3A, which is the difference between the currents $I_i$ and $I_{i-1}$. As soon as the amplitude of the current difference $I_{diffi}$ exceeds the threshold value $I_D$ (for example 800 A here), the current detection module $DC_i$ commands the gas monitoring module $MG_i$ to trigger at the time $t_t$ a succession of measurements of the pressure of the gas during a period $\Delta\tau$ equal to 500 ms, for example (which period is advantageously compatible with precise location of the place at which arcing occurs in a compartment 70 m long based on the speed of the wave in the gas, which is 136 meters per second (m/s). Moreover, the values of the current differences $I_{diff,i}$ stored in circulating memory are stored in permanent memory in the module $DC_i$. A calculation algorithm previously stored in the supervisory unit SP, for example an algorithm based on calculating the mathematical derivative of the current differences, then calculates from the time variations of the current differences stored in permanent memory the time $t_0$ that characterizes the occurrence of the fault in the compartment $CP_i$. After calculating the time $t_0$ the supervisory unit SP calculates the duration $\Delta t_i$ that separates the time $t_t$ from the time $t_0$.

In parallel with this, the pressure measurements are stored in the module $MG_i$ as soon as they begin. At the end of the pressure measuring period $\Delta\tau$ a calculation algorithm stored in the supervisory unit SP, for example an algorithm based on calculating the mathematical derivative of the pressure, is used to calculate from the time variations of the stored pressure measurements the time $t_m$ that characterizes the pressure wave reaching the pressure detector. Once the time $t_m$ has been calculated, the supervisory unit SP calculates the period $\Delta t_P$ that separates the time $t_m$ from the time $t_t$. The supervisory unit SP then calculates the period $\Delta t=\Delta t_i+\Delta t_P$ that separates the time the pressure wavefront reaches the pressure sensor from the time that characterizes the occurrence of the fault in the compartment. The distance d that separates the sensor from the place at which the fault has occurred is then calculated from the formula d=V/t in which V is the speed of propagation of sound in the gas (for example 136m/s for the gas $SF_6$).

In one variant of the invention, a plurality of pressure sensors may be used to measure the pressure of the gas in the same compartment. This applies if the compartments are of great length and/or it is possible that pressure waves triggered by the occurrence of electrical arcing may not be detected by a single detector too far away from the arc. For example, two pressure sensors may be mounted on the same compartment, a first sensor near a first end of the compartment and the other sensor near the opposite end of the compartment. The two pressure sensors are then triggered simultaneously and it is the measurements effected by at least one of the two pressure sensors that contribute to locating the fault. Here the current toroid is placed at the center of the compartment, for example.

Figure 6:
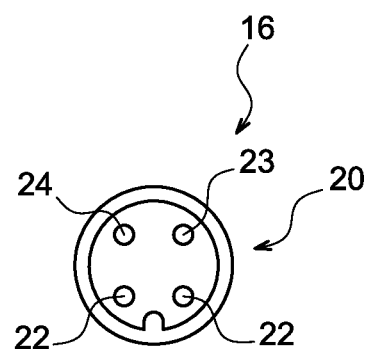
FIGS. 4-6 are detailed views of a current toroid that is part of the device of a preferred embodiment of the invention for locating an internal arc in a gas-insulated line.
Figure 4:
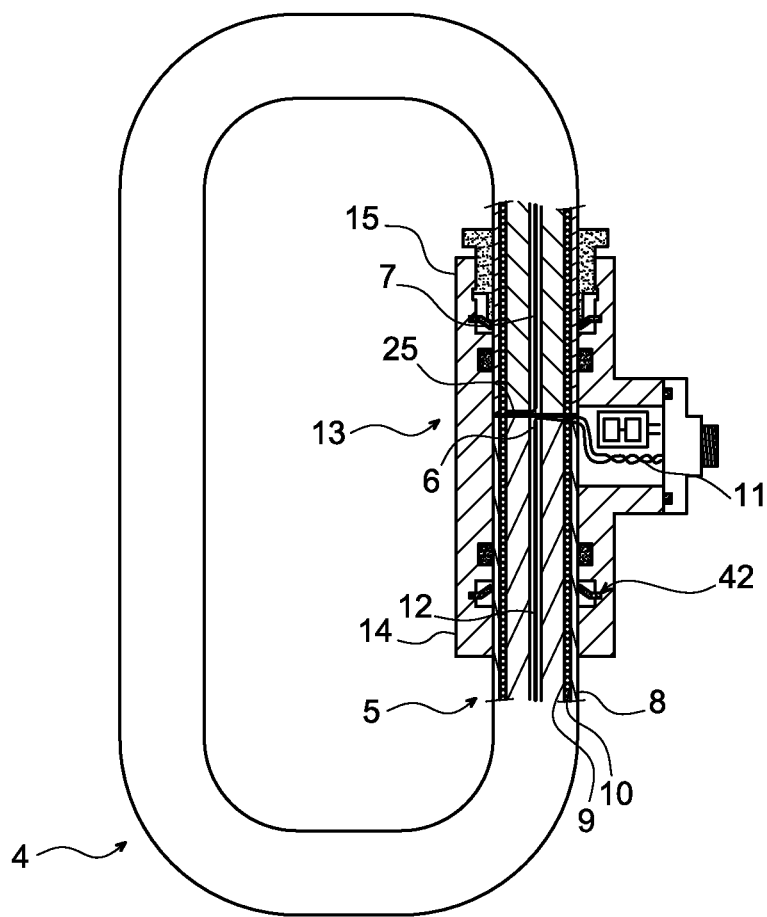
Figure 5:
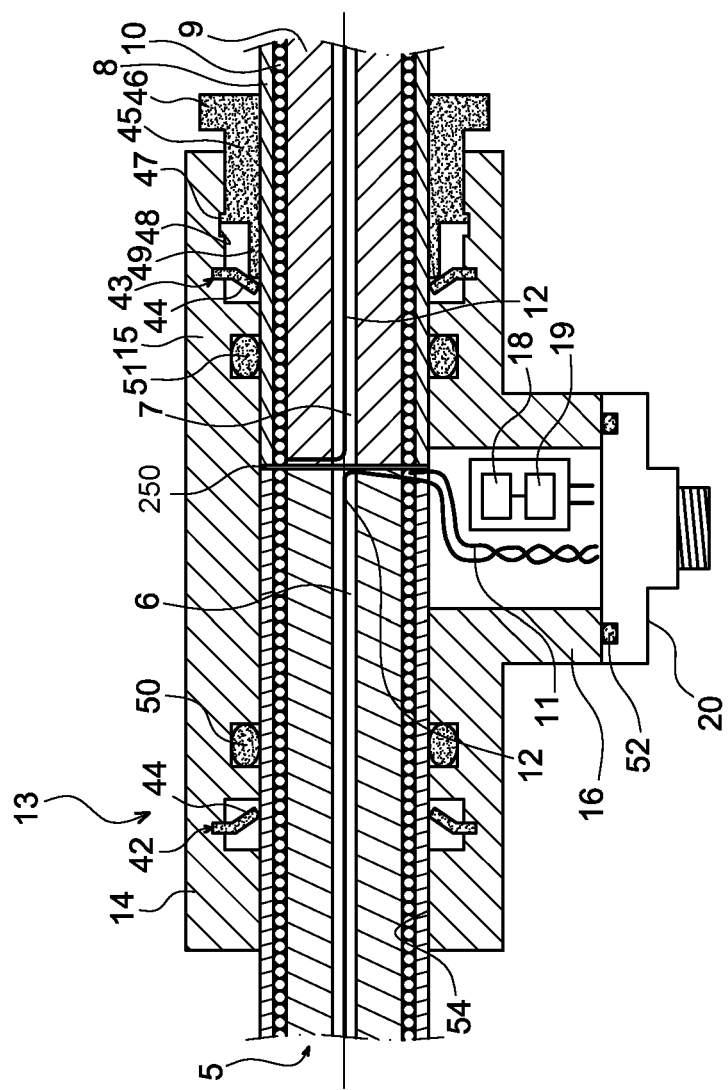

FIGS. 4-6 represent by way of non-limiting example detailed views of a current toroid that is part of a device of the preferred embodiment of the invention for locating an internal arc in a gas-insulated line:

FIG. 4 is a general view of the current toroid;

FIG. 5 is a detailed view of the current toroid; and

FIG. 6 is a view in section showing how the current toroid is electrically connected.

Figure 7:
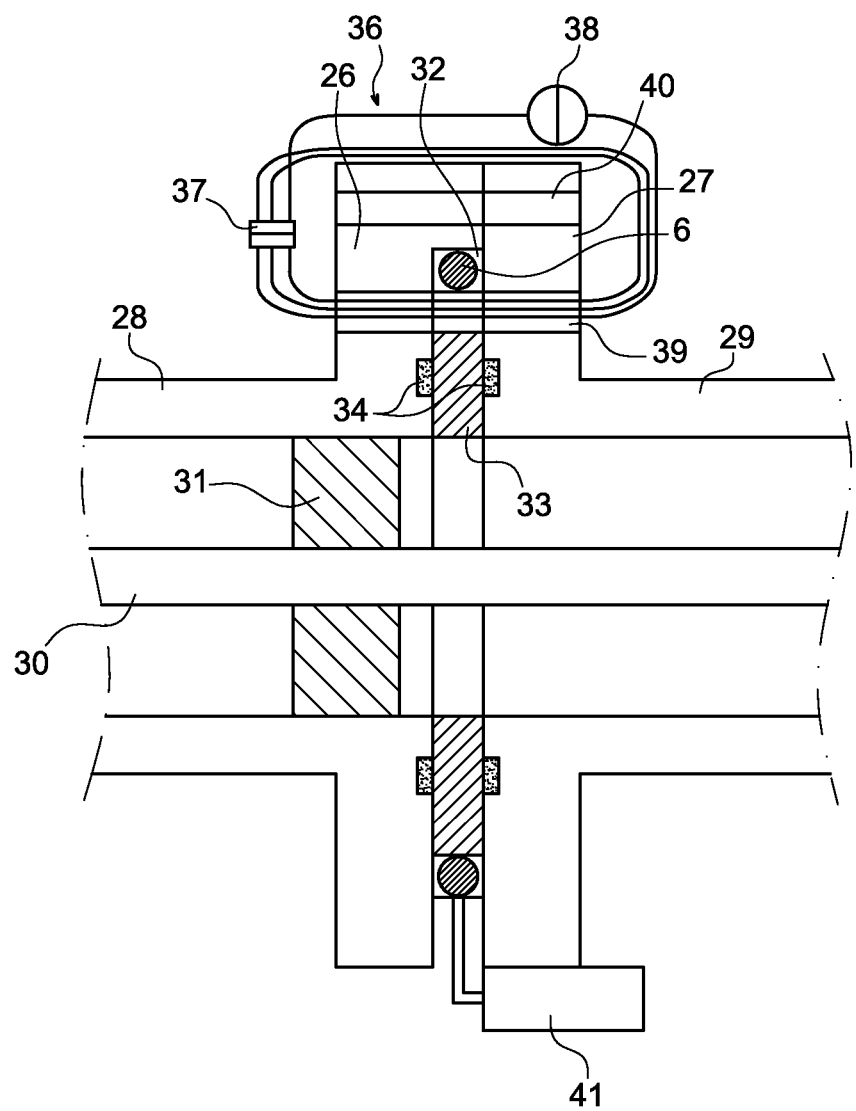
FIGS. 7 and 8 are two detailed views of the current toroid represented in FIGS. 4-6 on a gas-insulated line.
Figure 8:
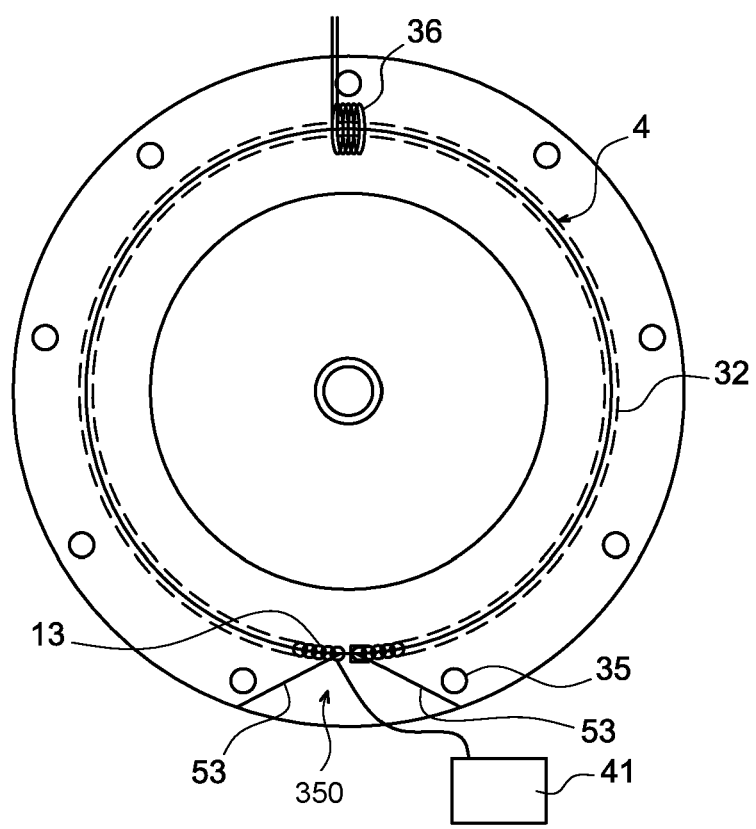

FIGS. 7 and 8 are two views of equipment fitted with a current toroid, respectively in axial section and in diametral section.

The toroid is formed by a cable 5 looped by abutting its ends one against the other. The cable 5 has an external jacket layer 8 with an outside diameter of 14 millimeters (mm), which layer may be made of flexible polyurethane, and an inner polyurethane or polyamide jacket layer 9 concentric with the previous layer. A conductive wire winding 10 between the two jacket layers extends the entire length of the cable 5, from one end 6 to the other end 7, and may be insulated by a plastic jacket or a varnish. The winding 10 terminates at an input wire 11 leaving the cable 5 and an output wire 12 extending inside the internal jacket 9 from the end 7 as far as the other end 6 before also leaving the cable 5. The internal jacket layer 9 is advantageously relatively thick so as not to transmit large movements of the output wires 12 and to maintain it at the center of the cable 5. The sensor 4 further comprises a connector 13 in the form of a sleeve comprising a first branch 14 for fixedly accommodating the end 6, a second branch 15 for receiving the other end 7 so that it may be moved and completely extracted, and a third branch 16, perpendicular to the preceding branches, which receives the input wire 11 and the output wire 12.

The third branch 16 further includes a temperature probe 18 and a parameter storage device 19 containing the serial number of the sensor 4 and its calibration parameters, which make it possible by preliminary calibration to correlate the current induced in the winding 10 with a current flowing through the conductor around which the sensor is looped. The third branch 16 terminates at an electrical connection plug 20 comprising a connection 22 to the input wire 11, a connection 23 to the output wire 12, and a connection 24 to the devices 18 and 19. A control device (41 in other figures) connected to the branch 20 collects the current flowing through the winding 10 and controls the devices 18 and 19. It can also inject small amounts of current into the cable 5 periodically to verify its continuity. Because of the low amplitude of the output signal of the sensor (a few tens of millivolts per kiloamp), the control device is preferably located nearby, at most a few meters away. Moreover, the connecting cable includes an external shield to protect the signal against electromagnetic interference and the two pairs of wires that it contains, which go to the connections 21 to 24, are individually twisted. The control device amplifies and processes the output signal of the sensor as a function of what is required. It also authorizes correction of this signal as a function of the parameters of the temperature probe 18 and the calibration parameters of the device 19.

According to the invention, a hole 54 passes completely through the sleeve 13 at the locations of the first branch 14 and the last branch 15, the ends 6 and 7 of the cable 5 are open, i.e. carry no terminal, and the winding 10 is flush with the end surfaces 25, which are straight (plain or without relief) and can therefore be abutted one against the other somewhere within the hole 54 by pushing the end 7 sufficiently into the last branch 15. The connector 13, which has an opening that passes completely through it in the first branch 14 and the last branch 15 and is perfectly cylindrical, enables the ends 6 and 7 to come into contact. The winding 10 then extends over an almost continuous circumference that ensures accurate measurement. Adjustment involves only abutting the cable 5 through this contact and is easy to effect reliably. No verification or recalibration is necessary. The cable 5 is flexible enough to bend in the hole 35 and to be inserted into the groove 32 from the outside and the hole 35 is relatively wide on the inside so that introducing the sleeve 13 and closing the looped cable 5 are also easy.

Figure 3C:
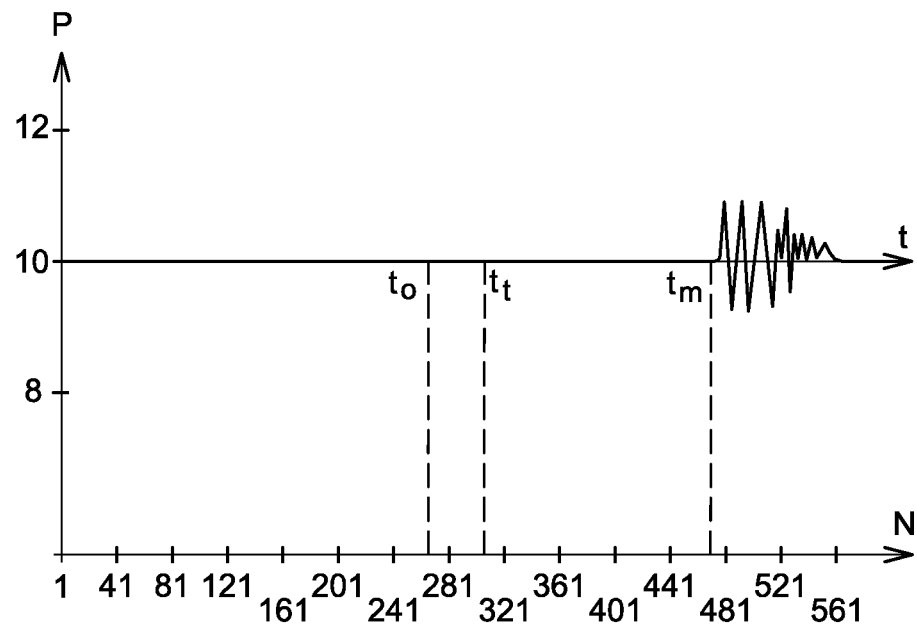

According to other important features, the sleeve 13 is provided with two circlips 42 and 43 for immobilizing the cable 5 in translation in the first branch 14 and the last branch 15, in which they are retained in grooves. The circlips 42 and 43 have facing open conical portions 44 rubbing on the external jacket 8 of the ends 6 and 7 so that inserting the ends 6 and 7 into the sleeve 13 is facilitated by elastic deformation of the conical portion 44 but their extraction is prevented because the conical portion is braced against extraction. The closure of the cable 5 is thus maintained under all circumstances except when a plunger 45 in the second branch 15 is moved. The plunger has an exterior portion 46 that extends out of the mobile sleeve 13 and is used to hold it, a lug 47 mobile in a groove 48 of finite length formed in the sleeve 13, and a point 49 directed toward the conical portion 44 of the circlip 43. Pushing on the exterior portion 46 pushes in the plunger 45 and the point 49 pushes back the conical portion by deforming it elastically and disengaging it from the end 7, which can then be withdrawn to open the loop of the cable 5. In the normal portion, represented in FIG. 3, the plunger 45 is separated from the circlip 43. The length and the position of the groove 47 are chosen to allow these two states. The first branch 14 of the sleeve 13 may instead have no plunger, the end 6 being permanently housed therein. The sleeve 13 further comprises two O-ring seals 50 and 51 in two other grooves in the branches 14 and 15 to press on the ends 6 and 7 of the cable 5 and seal the junction between them; the third branch 16 is itself isolated by an O-ring seal 52 that the end-piece 20 presses onto it.

FIGS. 5 and 6 illustrate the use of the sensor 4 with a gas-insulated shielded electric cable. Here the sensor 4 is between the flanges 26 and 27 for joining two sections 28 and 29 of the jacket of the electric cable 30 to be monitored, which lies at the center of the sections 28 and 29 and is supported by insulators 31. The sensor 4 is in a circular and continuous groove 32 in one of the flanges 26 around an insulating flange 33 complemented by gas seals 34. The control device 41 of the sensor 4 is represented fixed to the other flange 250. The groove 32 is advantageously circumscribed by bolt holes 40 in order to avoid degrading the measurements.

The essential feature of this embodiment of the invention is that the groove 32 communicates with the outside only via a fan-shaped opening 350 through which the sensor 4 may be inserted, starting with the end 6. The cable 5 thus moves forward in the groove 32, progressively curling up, and forms a loop naturally when the connector 13 has been pushed into the groove 32. The edges 53 of the opening 35 are as a matter of fact fairly close to the tangent to the groove 32 and the cable 5 is relatively flexible so that it can bend in the opening 35 and be inserted into the groove 32 from the outside; the opening 35 is relatively wide on the inside so that inserting the sleeve 13 and closing the loop of the cable 5 are also easy. This makes it possible to avoid having to remove the jacket of the cable 30 when it is necessary to work on the sensor 4.

Another feature provides an autonomous test winding 36 that may be used to test the sensor 4 by injecting a current that is added to the primary current. This relatively unobtrusive test winding 36 does not require any demounting. It may be an open cable that may be looped at a junction 37, comprising a plurality of turns and supplied with power by a current generator 38. It passes between the flange 33 and the sensor 4 through a hole 39 through the flanges 26 and 27. On the other side it passes around the outside of the flanges 26 and 27 to surround a section of the sensor 4.

The invention claimed is:

1. A method of locating an internal arc in a gas-insulated line consisting of a succession of compartments $CP_i$ (i=1, 2, ..., N) filled with gas, the method being characterized in that, for each compartment $CP_i$ being surrounded by a current toroid $TC_i$ respectively (i=1, 2, ..., N) through which there flows a current $I_i$ that is identical in the absence of interference from one compartment to another and being provided with at least one pressure sensor $P_i$ adapted to measure the pressure of the gas inside the compartment, the method comprises the following steps:
   reading (E1), at a sampling frequency, the currents $I_i$ that flow through the current toroids;
   calculating (E2), at the sampling frequency, current differences $I_{diffi}$ such that $I_{diffi} = I_{i+1} - I_i$, and storing the calculated current differences;
   comparing (E3) the stored current differences $I_{diffi}$ with a current threshold value and, as soon as a current difference is greater than or equal to the threshold value at a time $t_i$;
   triggering (E4) a succession of pressure measurements by the pressure sensor $P_i$, and storing the measured pressure values in response to the current difference being greater than or equal to the threshold value;
   calculating (E7) from a time variations of the stored pressure measurements a pressure rise time $t_m$ at which the pressure measured by the pressure sensor P, begins to increase;
   calculating (E8) a period $\Delta t_P$ that is the difference between the times $t_m$ and $t_i$;
   calculating (E5) a time $t_0$ that characterizes the occurrence of internal arcing in the compartment $CP_i$ from a time variations of the stored current differences;
   calculating (E6) a period $\Delta t_i$ that is the difference between the times $t_i$ and $t_0$;
   calculating (E9) a period $\Delta t$ that is the sum of the previously-calculated periods $\Delta_i$ and $\Delta t_P$; and
   calculating (E10) the distance d that separates the pressure sensor $P_i$ from a place at which a fault occurred using the equation $d = V/\Delta t$ in which V is the speed of propagation of sound in the gas.

2. A method according to claim 1, wherein the current toroid $TC_i$ surrounds a first end of the compartment $CP_i$ and the pressure sensor $P_i$ is mounted on an end of the compartment opposite the first end.

3. A method according to claim 1, wherein a first pressure sensor $P_i$ is mounted on the compartment at a first end of the compartment and a second pressure sensor $P_i$ is mounted on the compartment at an end of the compartment opposite the first end.

4. A device for locating an internal arc in a gas-insulated line consisting of a succession of compartments $CP_i$ (i=1, 2, ..., N) filled with gas, the device being characterized in that it comprises:
   N current toroids $TC_i$ (i=1, 2, ..., N), each surrounding a distinct compartment and having flowing through it a current $I_i$ that is identical in the absence of interference from one compartment to another;
   N detection processors $DC_i$(i=1, 2, ..., N), each able to read the current $I_i$ flowing through the current toroid $TC_i$ and the current $I_{i-1}$ flowing through the current toroid $TC_{i-1}$ and including means for calculating the differences between the currents $I_i$ and $I_{i-1}$, for storing the calculated current differences, and for delivering a command signal at a time $t_i$, as soon as the difference between the currents $I_i$ and $I_{i-1}$ is greater than or equal to a threshold;
   at least one pressure sensor $P_i$ mounted on each compartment $CP_i$ and adapted to measure the pressure of the gas inside the compartment;
   N gas monitoring modules $MG_i$ (i=1, 2, ..., N) each including means adapted to respond to the command signal by triggering successive measurements by the pressure sensor $P_i$ of the pressure of the gas contained in the compartment $CP_i$ and storing the successive pressure measurements effected in response to the current difference being greater than or equal to the threshold value; and a supervisory unit adapted to calculate:

from a time variations of the stored pressure measurements, a pressure rise time $t_m$ that is the time at which the pressure measured by the pressure sensor $P_i$ begins to increase;

a period $\Delta t_P$ that is the difference between the times $t_m$ and $t_t$;

from a time variations of the stored current differences, a time $t_0$ that characterizes the occurrence of internal arcing in the compartment $CP_i$;

a period $\Delta t_i$ that is the difference between the times $t_t$ and $t_0$;

a period $\Delta t$ that is the sum of the previously-calculated periods $\Delta t_i$ and $\Delta t_P$; and a distance d that separates the pressure sensor $P_i$ from a place at which the fault has occurred from the equation $d=V/\Delta t$ in which V is the speed of propagation of sound in the gas.

5. A device according to claim 4, wherein the current toroid $TC_i$ surrounds a first end of the compartment $CP_i$ and a pressure sensor $P_i$ is mounted on an end of the compartment opposite the first end.

6. A device according to claim 4, wherein a first pressure sensor $P_i$ is mounted on the compartment at a first end of the compartment, a second pressure sensor $P_i$ is mounted on the compartment at an end of the compartment opposite the first end, and the current toroid surrounds the compartment at the center of the compartment.

* * * * *